(12) United States Patent
Goto

(10) Patent No.: US 8,426,891 B2
(45) Date of Patent: Apr. 23, 2013

(54) SEMICONDUCTOR DEVICE AND METHOD OF FABRICATING THE SAME

(75) Inventor: Masakazu Goto, Ibaraki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 525 days.

(21) Appl. No.: 12/723,917

(22) Filed: Mar. 15, 2010

(65) Prior Publication Data

US 2010/0327372 A1 Dec. 30, 2010

(30) Foreign Application Priority Data

Jun. 26, 2009 (JP) ................. 2009-152675

(51) Int. Cl.
*H01L 31/072* (2012.01)
(52) U.S. Cl.
USPC .......... 257/192; 257/27; 257/69; 257/368; 257/410; 257/371; 257/392; 438/216; 438/261
(58) Field of Classification Search ........... 257/27, 257/69, 192, 368, 371, 392; 438/216, 261
See application file for complete search history.

(56) References Cited

U.S. PATENT DOCUMENTS

2010/0176460 A1 7/2010 Goto

FOREIGN PATENT DOCUMENTS

JP 2008010611 1/2008

OTHER PUBLICATIONS

Goto, et al.; Impact of Tantalum Composition in TaC/HfSiON Gate Stack on Device Performance of Aggressively Scaled CMOS Devices with SMT and Strained CESL, Symposium on VLSI Technology Digest of Technical Papers, 2008, pp. 132-133.

*Primary Examiner* — Samuel Gebremariam
(74) *Attorney, Agent, or Firm* — Turocy & Watson, LLP

(57) ABSTRACT

A semiconductor substrate according to one embodiment includes: a first transistor having a first gate insulating film formed on a semiconductor substrate, a first gate electrode formed on the first gate insulating film and a first sidewall formed on a side face of the first gate electrode, the first gate insulating film comprising a high-dielectric constant material as a base material, a part of the first sidewall contacting with the first gate insulating film and containing Si and N; and a second transistor having a second gate insulating film formed on the semiconductor substrate, a second gate electrode formed on the second gate insulating film and a second sidewall formed on a side face of the second gate electrode so as to contact with the second gate insulating film, the second gate insulating film comprising a high-dielectric constant material as a base material, a part of the second sidewall contacting with the second gate insulating film and containing Si and N, wherein at least one of an abundance ratio of Si—H bond to N—H bond per unit volume, an amount of Cl per unit volume and an amount of H per unit volume of the second sidewall is larger than that of the first sidewall; and a threshold voltage of the second transistor is higher than that of the first transistor.

8 Claims, 8 Drawing Sheets

US 8,426,891 B2

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2009-152675, filed on Jun. 26, 2009, the entire contents of which are incorporated herein by reference.

BACKGROUND

Thinning of gate insulating film has been promoted in a MISFET (Metal Insulator Semiconductor Field Effect Transistor) element in order to ensure sufficient gate capacitance, however, as a result, the problem of increase of a leak current between a gate and a substrate due to tunneling arises.

Thus, a technique is used in which generation of tunneling is suppressed by using a high-dielectric constant material for a material of a gate insulating film. On the other hand, it is known that fixed charge is generated in a high-dielectric constant gate insulating film, which leads to shift threshold voltage. The technique, for example, is disclosed in JP-A 2008-010611.

BRIEF SUMMARY

A semiconductor substrate according to one embodiment includes: a first transistor having a first gate insulating film formed on a semiconductor substrate, a first gate electrode formed on the first gate insulating film and a first sidewall formed on a side face of the first gate electrode, the first gate insulating film comprising a high-dielectric constant material as a base material, a part of the first sidewall contacting with the first gate insulating film and containing Si and N; and a second transistor having a second gate insulating film formed on the semiconductor substrate, a second gate electrode formed on the second gate insulating film and a second sidewall formed on a side face of the second gate electrode so as to contact with the second gate insulating film, the second gate insulating film comprising a high-dielectric constant material as a base material, a part of the second sidewall contacting with the second gate insulating film and containing Si and N, wherein at least one of an abundance ratio of Si—H bond to N—H bond per unit volume, an amount of Cl per unit volume and an amount of H per unit volume of the second sidewall is larger than that of the first sidewall; and a threshold voltage of the second transistor is higher than that of the first transistor.

A method of fabricating a semiconductor device according to another embodiment includes: forming an element isolation region on an semiconductor substrate so as to isolate a first region from a second region; forming a first gate electrode on the semiconductor substrate in the first region via a first gate insulating film comprising a high-dielectric constant material, and a second gate electrode on the semiconductor substrate in the second region via a second gate insulating film comprising a high-dielectric constant material; forming a first sidewall on a side face of the first gate electrode, a part of the first sidewall contacting with the first gate insulating film and containing Si and N; and forming a second sidewall on a side face of the second gate electrode, a part of the second sidewall contacting with the second gate insulating film and containing Si and N, wherein a formation condition of the first sidewall is different from that of the second sidewall in at least one of film forming method, Si raw material and film forming temperature; and a difference between an amount of fixed charge of the first gate insulating film and that of the second gate insulating film is generated by forming the first and second sidewalls.

DETAILED DESCRIPTION

[First Embodiment]

Figure 1:
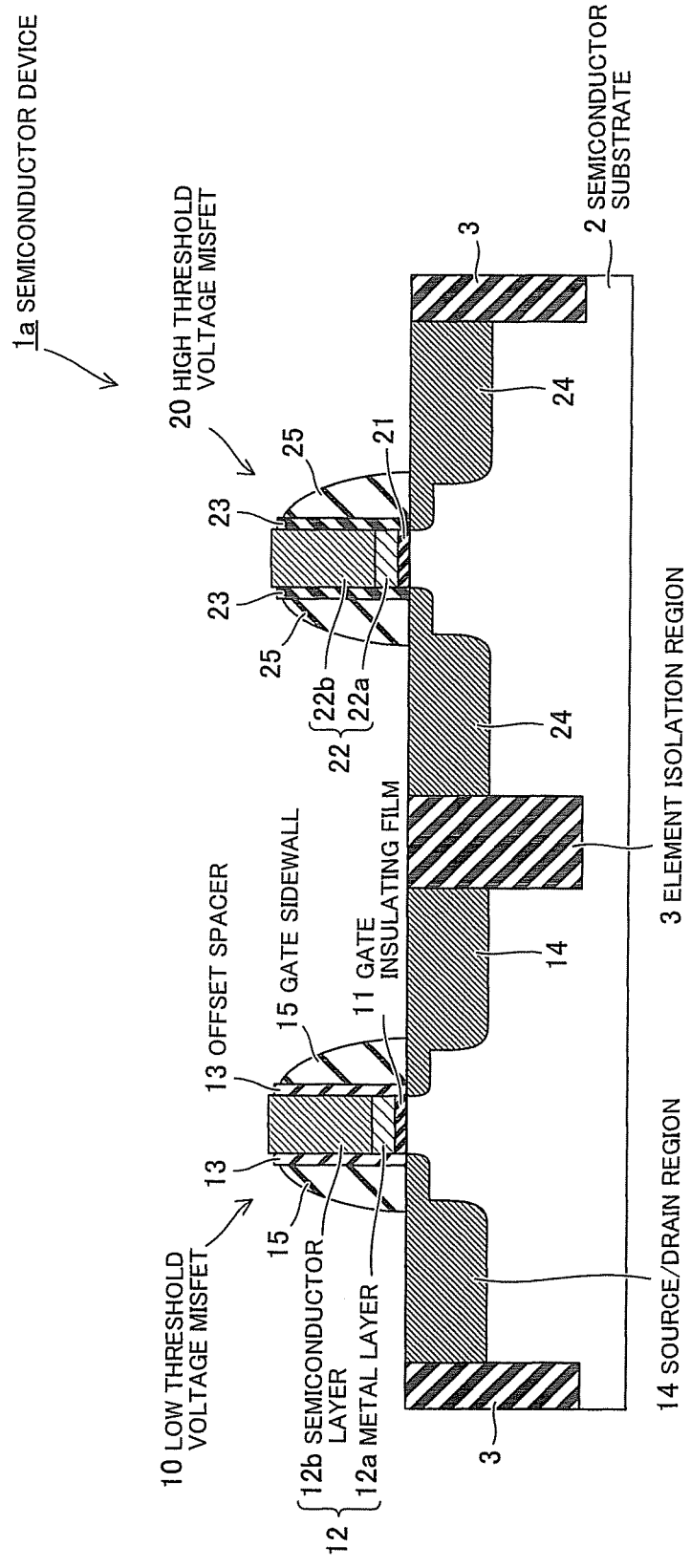
FIG. 1 is a cross sectional view of a semiconductor device according to a first embodiment.

FIG. 1 is a cross sectional view of a semiconductor device 1a according to the first embodiment. The semiconductor device 1a has a low threshold voltage MISFET 10 and a high threshold voltage MISFET 20 on a semiconductor substrate 2. The low threshold voltage MISFET 10 and the high threshold voltage MISFET 20 are electrically isolated by an element isolation region 3.

A threshold voltage of the high threshold voltage MISFET 20 is higher than that of the low threshold voltage MISFET 10. In other words, when the low threshold voltage MISFET 10 and the high threshold voltage MISFET 20 are n-type MISFETs and the threshold voltages of the both are positive values, magnitude of the threshold voltages (an absolute value of threshold voltage) of the high threshold voltage MISFET 20 is larger than that of the low threshold voltage MISFET 10. Meanwhile, when the low threshold voltage MISFET 10 and the high threshold voltage MISFET 20 are p-type MISFETs and the threshold voltages of the both are negative values, magnitude of the threshold voltage of the high threshold voltage MISFET 20 is smaller than that of the low threshold voltage MISFET 10.

The semiconductor substrate 2 is made of Si-based crystal such as Si crystal.

The element isolation region 3 is made of, e.g., insulating material such as $SiO_2$, and has a STI (Shallow Trench Isolation) structure.

The low threshold voltage MISFET 10 has a gate electrode 12 formed on the semiconductor substrate 2 via a gate insulating film 11, offset spacers 13 formed on side faces of the gate electrode 12 so as to be in contact with the gate insulating film 11, gate sidewalls 15 formed on side faces of the offset spacers 13, and source/drain regions 14 formed in the semiconductor substrate 2 on both sides of the gate electrode 12. Note that, although it is not shown in the figures, a well may be formed in a region in the semiconductor substrate 2 below the low threshold voltage MISFET 10.

The high threshold voltage MISFET 20 has a gate electrode 22 formed on the semiconductor substrate 2 via a gate insulating film 21, offset spacers 23 formed on side faces of the gate electrode 22 so as to be in contact with the gate insulating film 21, gate sidewalls 25 formed on side faces of the offset spacers 23, and source/drain regions 24 formed in the semiconductor substrate 2 on both sides of the gate electrode 22. Note that, although it is not shown in the figures, a well may be formed in a region in the semiconductor substrate 2 below the high threshold voltage MISFET 20.

The gate insulating films 11 and 21 are made of a material of which base material is a high-dielectric constant material having high-dielectric constant. Here, the base material means a main material which composes the gate insulating films 11 and 21. The gate insulating films 11 and 21 may contain an impurity besides the base material. For example, an element such as H or Cl which is introduced by formation of the below-described offset spacers 13 and 23 may be contained in the gate insulating films 11 and 21 as the impurity. For example, an Hf-based compound such as HfSiON, HfSiO or HfO, or a Zr-based compound such as ZrSiON, ZrSiO or ZrO is used as the high-dielectric constant material.

In general, it is know that, when a gate insulating film using a high-dielectric constant material as a base material is used, a threshold voltage of MISFET shifts due to fixed charge in the gate insulating film.

Alternatively, an impurity such as La, Mg, Al or Ge may be introduced into the gate insulating films 11 and 21 for the purpose of auxiliary adjusting the threshold voltages of the low threshold voltage MISFET 10 and the high threshold voltage MISFET 20. In addition, a different impurity among the above may be each introduced into the gate insulating films 11 and 21, or these impurities may be introduced into only one of them.

The gate electrode 12 includes a metal layer 12a formed on the gate insulating film 11 and a semiconductor layer 12b formed on the metal layer 12a. Meanwhile, the gate electrode 22 includes a metal layer 22a formed on the gate insulating film 22 and a semiconductor layer 22b formed on the metal layer 22a.

The metal layers 12a and 22a have a function as a metal gate for preventing depletion of the gate electrodes 12 and 22. The metal layers 12a and 22a are made of, e.g., Ti, Ta, W, Mo or Ru, a nitride thereof, a carbide thereof, or a compound of those metals with Si (TiN, TaSiN or TaC, etc.).

The semiconductor layers 12b and 22b are made of Si-based polycrystal, such as polycrystalline Si or polycrystalline SiGe, containing a conductivity type impurity. In addition, silicide layers may be formed in the upper or entire portion of the semiconductor layers 12b and 22b. It is possible to improve consistency with a conventional polycrystalline Si gate electrode process by forming the semiconductor layers 12b and 22b in the upper portions of the gate electrodes 12 and 22.

The gate sidewalls 15 and 25 may have a single layer structure comprising, e.g., SiN, or a structure of two layers comprising, e.g., SiN and $SiO_2$, furthermore, may have a structure of three or more layers.

The source/drain regions 14 and 24 are formed by implanting a conductivity type impurity into the semiconductor substrate 2. In addition, silicide layers may be formed in upper portions of the source/drain regions 14 and 24.

The offset spacers 13 and 23 are made of insulating material consisting mainly of SiN such as SiN or SiON. At least a part of offset spacers 13 and 23 which respectively contacts with the gate insulating films 11 and 21 contains Si and N. The thicknesses of the offset spacers 13 and 23 are factors for determining positions of edges of extension regions of the source/drain regions 14 and 24.

At least one of film forming method, Si raw material used for forming a film and film forming temperature is different between the offset spacer 13 and the offset spacer 23.

In detail, when a SiN film as an offset spacer is formed by a CVD (Chemical Vapor Deposition) method, the threshold voltage of MISFET is higher than when the SiN film is formed by an ALD (Atomic Layer Deposition) method. In other words, magnitude of the threshold voltage of n-type MISFET is large and that of p-type MISFET is small.

One of the reasons is considered that, when CVD method is used, an abundance ratio of Si—H bond to N—H bond (the number of Si—H bond/the number of N—H bond) per unit volume in a SiN film is larger than when ALD method is used. It is considered that negative fixed charge in the gate insulating film increases (positive fixed charge decreases) with increasing the abundance ratio of Si—H bond to N—H bond in an offset spacer.

Therefore, when different film forming methods are used for the offset spacer 13 and the offset spacer 23, the offset spacer 23 of the high threshold voltage MISFET 20 is formed using CVD method and the offset spacer 13 of the low threshold voltage MISFET 10 is formed using ALD method. As a result, it is possible to make the threshold voltage of the high threshold voltage MISFET 20 higher than that of the low threshold voltage MISFET 10.

Note that, it is possible to use a combination of film forming methods such that the threshold voltage of the high threshold voltage MISFET 20 becomes higher than that of the low threshold voltage MISFET 10, other than the combination of CVD method and ALD method.

In addition, when DCS (dichlorosilane: $SiH_2Cl_2$) is used as a Si raw material of SiN film as the offset spacer, the threshold voltage of a MISFET is higher than when BTBAS (bis [tertiary-butylamino-silane]: $SiH_2[NH(C_4H_9)]$) is used as the Si raw material. In other words, the magnitude of the threshold voltage of an n-type MISFET is large and that of a p-type MISFET is small.

One of the reasons is considered that, when the DCS is used, an amount of Cl impurity per unit volume in the offset spacer is larger than when BTBAS is used. It is considered that negative fixed charge in the gate insulating film increases (positive fixed charge decreases) with increasing the amount of Cl impurity per unit volume in the offset spacer.

Therefore, when different Si raw materials are used for the offset spacer 13 and the offset spacer 23, the offset spacer 23 of the high threshold voltage MISFET 20 is formed using DCS and the offset spacer 13 of the low threshold voltage MISFET 10 is formed using BTBAS. As a result, it is possible to make the threshold voltage of the high threshold voltage MISFET 20 higher than that of the low threshold voltage MISFET 10.

Note that, it is possible to use a combination of Si raw materials such that the threshold voltage of the high threshold voltage MISFET 20 becomes higher than that of the low threshold voltage MISFET 10, other than the combination of DCS and BTBAS.

In addition, when the SiN film as an offset spacer is formed under high temperature conditions, the threshold voltage of a MISFET is higher than when the SiN film is formed under low temperature conditions. In other words, the magnitude of the threshold voltage of an n-type MISFET is large and that of a p-type MISFET is small.

One of the reasons is considered that, when the SiN film is formed under high temperature conditions, reactivity of the offset spacer with the gate insulating film is increased compared with when the SiN film is formed under low temperature conditions, and thus an amount of impurity such as Cl or H introduced into the gate insulating film increases. It is considered that negative fixed charge in the gate insulating film increases (positive fixed charge decreases) with increasing the amount of impurity introduced into the gate insulating film.

Therefore, when the film formation temperature of the offset spacer 13 is different from that of the offset spacer 23, the temperature for forming the offset spacer 23 of the high threshold voltage MISFET 20 is adjusted to be higher than that for forming the offset spacer 13 of the low threshold voltage MISFET 10. As a result, it is possible to make the threshold voltage of the high threshold voltage MISFET 20 higher than that of the low threshold voltage MISFET 10.

Note that, according to this method, even when a base material of the gate insulating film 11 and that of the gate insulating film 21 are the same high-dielectric constant material, an amount of impurity such as Cl or H in the gate insulating film 21 is larger than that in the gate insulating film 11, thus, it is possible to make the threshold voltage of the high threshold voltage MISFET 20 higher than that of the low threshold voltage MISFET 10.

Therefore, in order to increase the threshold voltage of the high threshold voltage MISFET 20 as much as possible, the offset spacer 23 is preferably formed under the condition in which a film forming method is CVD method, a Si raw material is DCS and a film forming temperature is as high as possible. Meanwhile, in order to decrease the threshold voltage of the low threshold voltage MISFET 10 as much as possible, the offset spacer 13 is preferably formed under the condition in which a film forming method is ALD method, a Si raw material is BTBAS and a film forming temperature is as low as possible as well as lower than that for the offset spacer 23.

Note that, when CVD method is used as a film forming method and DCS is used as a Si raw material, the film forming temperature of the SiN film is generally about 600-800° C. Meanwhile, when CVD method is used as a film forming method and BTBAS is used as a Si raw material, the film forming temperature of the SiN film is generally about 500-700° C. In addition, when ALD method is used as a film forming method and DCS is used as a Si raw material, the film forming temperature of the SiN film is generally about 450-650° C. In addition, when ALD method is used as a film forming method and BTBAS is used as a Si raw material, the film forming temperature of the SiN film is generally about 450-650° C.

Figure 2:
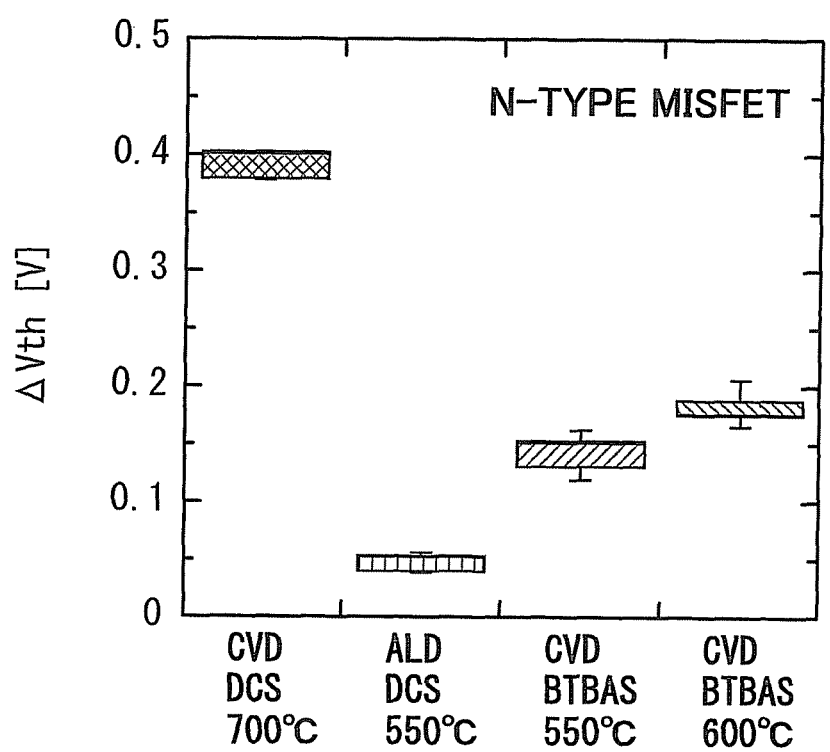
FIG. 2 is a graph showing threshold voltages of four types of n-type MISFETs having offsets spacer each formed under different conditions.

FIG. 2 shows an experimental result showing a relation between the threshold voltage of an n-type MISFET and the formation condition of the offset spacer.

FIG. 2 is a graph showing threshold voltages of four types of n-type MISFETs having offset spacers formed under different conditions. $\Delta V_{th}[V]$ of the vertical axis is the magnitude of the threshold voltage of an n-type MISFET having a gate length of 50 nm with reference to the magnitude of the threshold voltage of an n-type MISFET having a gate length of 1000 nm. The reason why the magnitude of the threshold voltage of an n-type MISFET having a gate length of 1000 nm is used as the reference is that the fixed charge would not affect the threshold voltage of a MISFET when the MISFET has sufficient gate length of 1000 nm.

The leftmost $\Delta V_{th}[V]$ in FIG. 2 is $\Delta V_{th}[V]$ when the offset spacer is formed under the condition in which a film forming method is CVD method, a Si raw material is DCS and a film forming temperature is 700° C. (hereinafter, referred to as "condition 1"). Meanwhile, the second from the left is $\Delta V_{th}[V]$ when the offset spacer is formed under the condition in which a film forming method is ALD method, a Si raw material is DCS and a film forming temperature is 550° C. (hereinafter, referred to as "condition 2"). In addition, the third from the left is $\Delta V_{th}[V]$ when the offset spacer is formed under the condition in which a film forming method is CVD method, a Si raw material is BTBAS and a film forming temperature is 550° C. (hereinafter, referred to as "condition 3"). In addition, the fourth from the left is $\Delta V_{th}[V]$ when the offset spacer is formed under condition in which a film forming method is CVD method, a Si raw material is BTBAS and a film forming temperature is 600° C. (hereinafter, referred to as "condition 4").

The condition 2 is different from the condition 1 in that the film forming method is ALD method and the film forming temperature is low. As a result, $\Delta V_{th}[V]$ under the condition 2 is lower than that under condition 1.

Meanwhile, the condition 3 is different from the condition 1 in that the Si raw material is BTBAS and the film forming temperature is low. As a result, $\Delta V_{th}[V]$ under the condition 3 is lower than that under condition 1. In this regard, however, since $\Delta V_{th}[V]$ under the condition 3 is higher than that under condition 2, it is understood that an amount of decrease in $\Delta V_{th}[V]$ in case of changing the film forming method from CVD method to ALD method is larger than that in case of changing the Si raw material from DCS to BTBAS in an n-type MISFET.

In addition, the condition 4 is different from the condition 1 in that the Si raw material is BTBAS and the film forming temperature is low. As a result, $\Delta V_{th}[V]$ under the condition 4 is lower than that under condition 1. Meanwhile, $\Delta V_{th}[V]$ under the condition 4 is higher than that under the condition 3 since the film forming temperature of condition 4 is higher than that of the condition 3.

Figure 3:
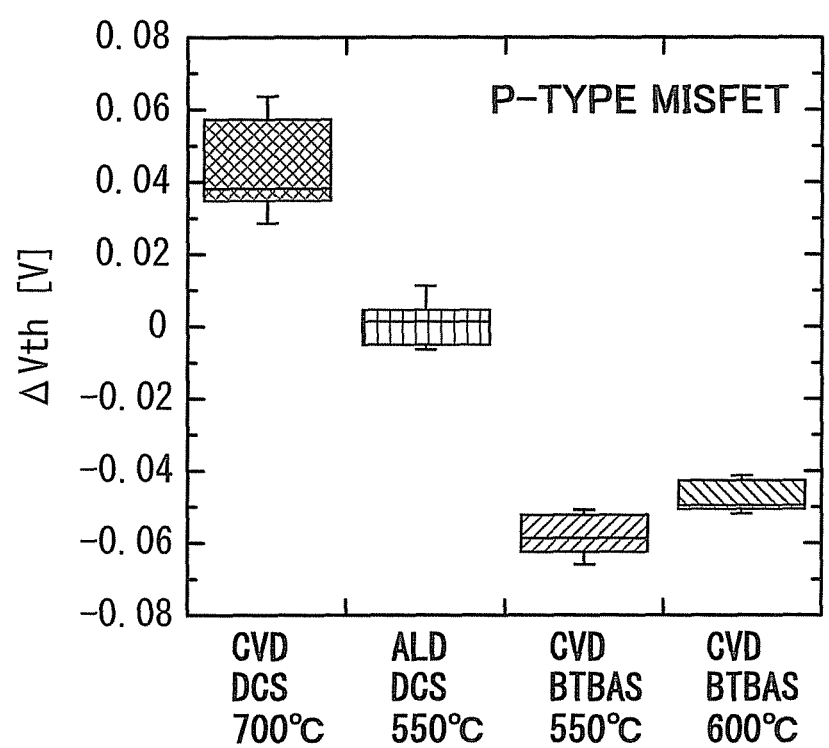
FIG. 3 is a graph showing threshold voltages of four types of p-type MISFETs having offsets spacer each formed under different conditions.

FIG. 3 shows an experimental result showing a relation between the threshold voltage of a p-type MISFET and the formation condition of the offset spacer.

FIG. 3 is a graph showing threshold voltages of four types of p-type MISFETs having offset spacers formed under different conditions. $\Delta V_{th}[V]$ of the vertical axis is the magnitude of the threshold voltage of a p-type MISFET having a gate length of 50 nm with reference to the magnitude of the threshold voltage of a p-type MISFET having a gate length of 1000 nm.

The leftmost $\Delta V_{th}[V]$ in FIG. 3 is $\Delta V_{th}[V]$ when the offset spacer is formed under the condition 1. Meanwhile, the second from the left is $\Delta V_{th}[V]$ when the offset spacer is formed under the condition 2. In addition, the third from the left is $\Delta V_{th}[V]$ when the offset spacer is formed under the condition 3. In addition, the fourth from the left is $\Delta V_{th}[V]$ when the offset spacer is formed under the condition 4.

The condition 2 is different from the condition 1 in that the film forming method is ALD method and the film forming temperature is low. As a result, $\Delta V_{th}[V]$ under the condition 2 is lower than that under condition 1.

Meanwhile, the condition 3 is different from the condition 1 in that the Si raw material is BTBAS and the film forming temperature is low. As a result, $\Delta V_{th}[V]$ under the condition 3 is lower than that under condition 1. In this regard, however, since $\Delta V_{th}[V]$ under the condition 3 is lower than that under condition 2, it is understood that an amount of decrease in $\Delta V_{th}[V]$ in case of changing the Si raw material from DCS to BTBAS is larger than that in case of changing the film forming method from CVD method to ALD method in a p-type MISFET.

In addition, the condition 4 is different from the condition 1 in that the Si raw material is BTBAS and the film forming temperature is low. As a result, $\Delta V_{th}[V]$ under the condition 3 is lower than that under condition 1. Meanwhile, $\Delta V_{th}[V]$ under the condition 4 is higher than that under the condition 3 since the film forming temperature of condition 4 is higher than that of the condition 3.

Following is variation in threshold voltage of n-type and p-type MISFETs, which is estimated based on the experimental results shown in FIGS. 2 and 3, when the film forming method of the offset spacer, the Si raw material used for forming a film or the film forming temperature is changed.

Firstly, it will be explained about a relation between the threshold voltage of an n-type MISFET and the film forming method of the offset spacer when offset spacers of two n-type MISFETs are respectively formed by two types of conditions of which main difference is the film forming method. Similarly, it will be explained about a relation between the threshold voltage of a p-type MISFET and the film forming method of the offset spacer when offset spacers of two p-type MISFETs are respectively formed by the above-mentioned two types of conditions.

It is considered that, when the offset spacer is formed under the condition in which a film forming method is CVD method, a Si raw material is DCS and a film forming temperature is 700° C., the threshold voltage of an n-type MISFET and that of a p-type MISFET both increase compared with when the offset spacer is formed under the condition in which a film forming method is ALD method, a Si raw material is DCS and a film forming temperature is 650° C.

Meanwhile, it is considered that, when the offset spacer is formed under the condition in which a film forming method is CVD method, a Si raw material is BTBAS and a film forming temperature is 550° C., the threshold voltage of an n-type MISFET and that of a p-type MISFET both increase compared with when the offset spacer is formed under the condition in which a film forming method is ALD method, a Si raw material is BTBAS and a film forming temperature is 550° C.

The above contents follow the contents that, when the SiN film as an offset spacer is formed by CVD method, the threshold voltage of a MISFET is higher than when the SiN film is formed by ALD method.

Next, it will be explained about a relation between the threshold voltage of an n-type MISFET and the Si raw material of the offset spacer when offset spacers of two n-type MISFETs are respectively formed by two types of conditions of which main difference is the Si raw material. Similarly, it will be explained about a relation between the threshold voltage of a p-type MISFET and the Si raw material of the offset spacer when offset spacers of two p-type MISFETs are respectively formed by the above-mentioned two types of conditions.

It is considered that, when the offset spacer is formed under the condition in which a film forming method is CVD method, a Si raw material is DCS and a film forming temperature is 700° C., the threshold voltage of an n-type MISFET and that of a p-type MISFET both increase compared with when the offset spacer is formed under the condition in which a film forming method is CVD method, a Si raw material is BTBAS and a film forming temperature is 700° C.

Meanwhile, it is considered that, when the offset spacer is formed under the condition in which a film forming method is ALD method, a Si raw material is DCS and a film forming temperature is 550° C., the threshold voltage of an n-type MISFET and that of a p-type MISFET both increase compared with when the offset spacer is formed under the condition in which a film forming method is ALD method, a Si raw material is BTBAS and a film forming temperature is 550° C.

The above contents follow the contents that, when DCS is used as a Si raw material for the SiN film as an offset spacer, the threshold voltage of a MISFET is higher than when BTBAS is used as the Si raw material.

Next, it will be explained about a relation between the threshold voltage of an n-type MISFET and the film forming temperature of the offset spacer when offset spacers of two n-type MISFETs are respectively formed by two types of conditions of which main difference is the film forming temperature. Similarly, it will be explained about a relation between the threshold voltage of a p-type MISFET and the film forming temperature of the offset spacer when offset spacers of two p-type MISFETs are respectively formed by the above-mentioned two types of conditions.

It is considered that, when the offset spacer is formed under the condition in which a film forming method is CVD method, a Si raw material is DCS and a film forming temperature is 800° C., the threshold voltage of an n-type MISFET and that of a p-type MISFET both increases compared with when the offset spacer is formed under the condition in which a film forming method is CVD method, a Si raw material is DCS and a film forming temperature is 700° C.

Meanwhile, it has been found from the experimental result shown in FIG. 2 that, when the offset spacer is formed under the condition in which a film forming method is CVD method, a Si raw material is BTBAS and a film forming temperature is 600° C. (condition 4), the threshold voltage of an n-type MISFET and that of a p-type MISFET both increase compared with when the offset spacer is formed under the condition in which a film forming method is CVD method, a Si raw material is BTBAS and a film forming temperature is 550° C. (condition 3).

The above contents follow the contents that, when the SiN film as an offset spacer is formed under high temperature conditions, the threshold voltage of a MISFET is higher than when the SiN film is formed under low temperature conditions. However, it is considered that, when ALD method is used as a film forming method, almost no variation is observed in the threshold voltage of a MISFET even though the film forming temperature is changed.

An example of a method of fabricating a semiconductor device 1a according to the present embodiment will be described hereinafter.

FIGS. 4A to 4G are cross sectional views showing processes for fabricating the semiconductor device 1a according to the first embodiment.

Figure 4A:
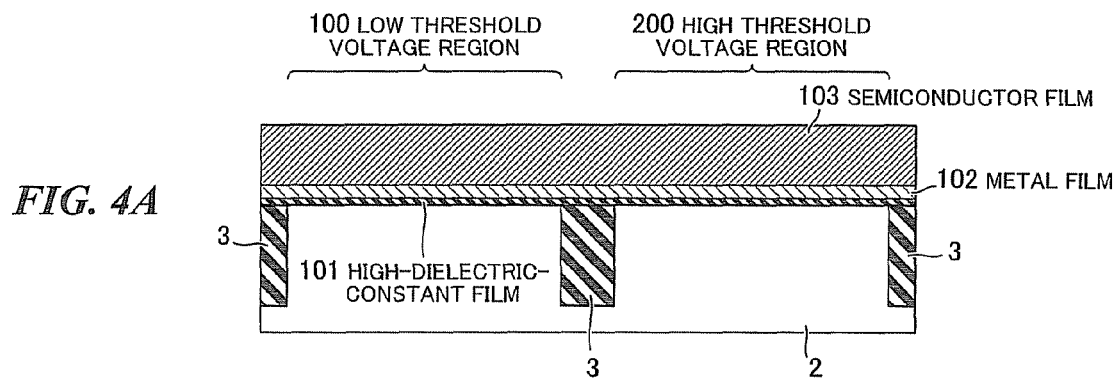
FIGS. 4A to 4G are cross sectional views showing processes for fabricating the semiconductor device according to the first embodiment.

Firstly, as shown in FIG. 4A, a low threshold voltage region 100 for forming the low threshold voltage MISFET 10 is isolated form a high threshold voltage region 200 for forming the high threshold voltage MISFET 20 by forming the element isolation region 3 on the semiconductor substrate 2, and subsequently, a high-dielectric-constant film 101, a metal film 102 and a semiconductor film 103 are formed on the semiconductor substrate 2 and the element isolation region 3.

Here, the element isolation region 3 is formed by, e.g., the following process. Firstly, a trench is formed in the semiconductor substrate 2 by photolithography and a RIE (Reactive Ion Etching) method. Next, a $SiO_2$ film is deposited in the trench by a CVD (Chemical Vapor Deposition) method, and is substantially planarized by a CMP (Chemical Mechanical Polishing) method for shaping into the element isolation region 3.

In addition, although it is not shown in the figures, after the element isolation region 3 is formed, a conductivity type impurity is introduced into the semiconductor substrate 2 by an ion implantation procedure for forming a channel region and a well. The conductivity type impurity in the channel region and the well is activated by heat treatment such as a RTA (Rapid Thermal Annealing) method. Note that, in the present embodiment, since the threshold voltage is adjusted by controlling the formation conditions of the offset spacers 13 and 23 or the like, It is not necessary that a concentration of the impurity introduced into the channel region of the high threshold voltage region 200 is higher than that introduced into the channel region of the low threshold voltage region 100 at this stage.

The high-dielectric-constant film 101 is formed by CVD method or plasma nitriding method, etc. Meanwhile, the metal film 102 is formed by PVD (Physical Vapor Deposition) method, etc. In addition, the semiconductor film 103 is formed by CVD method, etc.

Figure 4B:
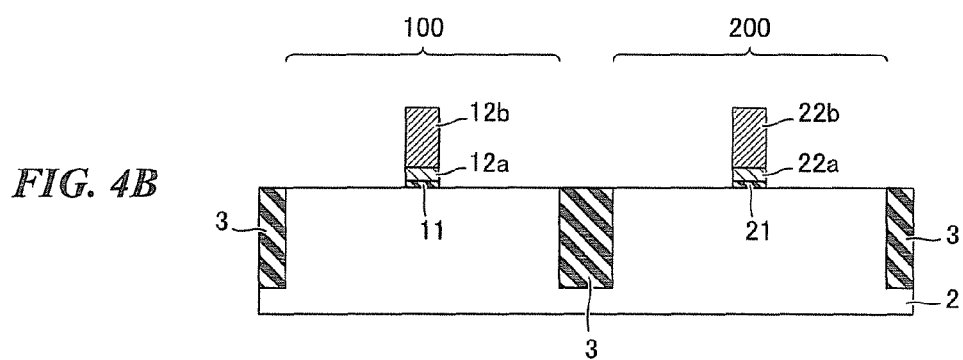

Next, as shown in FIG. 4B, the semiconductor film 103, the metal film 102 and the high-dielectric-constant film 101 are patterned by, e.g., a combination of photolithography method and RIE method. As a result, the semiconductor film 103 is shaped into the semiconductor layers 12b and 22b. In addition, the metal film 102 is shaped into the metal layers 12a and 22a. Then, the high-dielectric-constant film 101 is shaped into the gate insulating films 11 and 21.

Figure 4C:
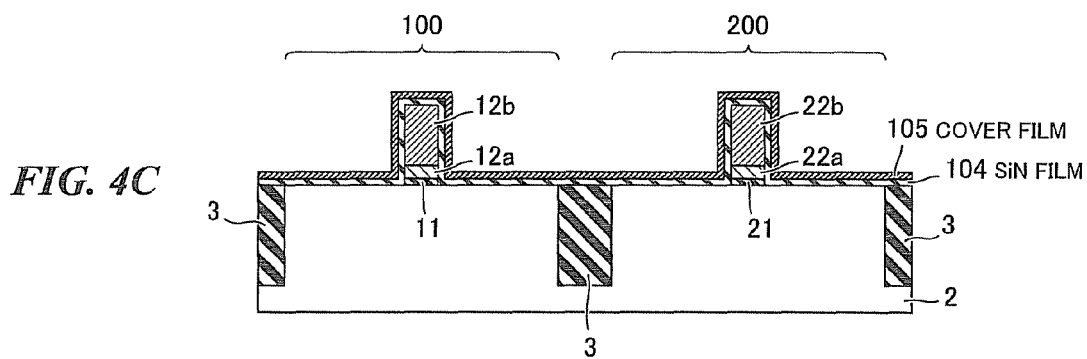

Next, as shown in FIG. 4C, a SiN film 104 and a cover film 105 are formed so as to cover the low threshold voltage region 100 and the high threshold voltage region 200 on the semiconductor substrate 2.

Here, the SiN film 104 is a film to be processed into the offset spacer 13 in a posterior process, and is formed under the condition in which, e.g., a film forming method is ALD method, a Si raw material is BTBAS and a film forming temperature is 550° C. In addition, the cover film 105 is made of, e.g., $SiO_2$-based insulating material.

Figure 4D:
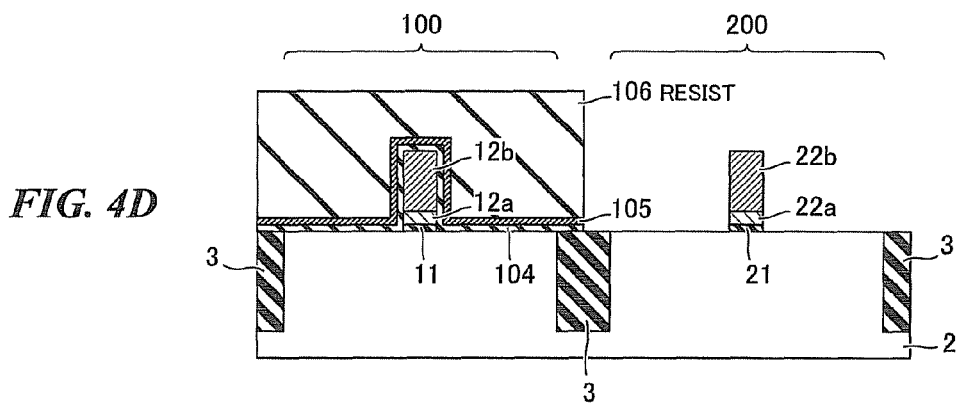

Next, as shown in FIG. 4D, after a resist 106 is formed so as to cover the low threshold voltage region 100, etching is performed on the high threshold voltage region 200 using the resist 106 as a mask in order to selectively remove the cover film 105 and the SiN film 104 in the high threshold voltage region 200.

Here, the cover film 105 is removed by, e.g., a wet etching method using dilute hydrofluoric acid solution. Meanwhile, the SiN film 104 is removed by, e.g., a wet etching method using hot phosphoric acid solution.

Figure 4E:
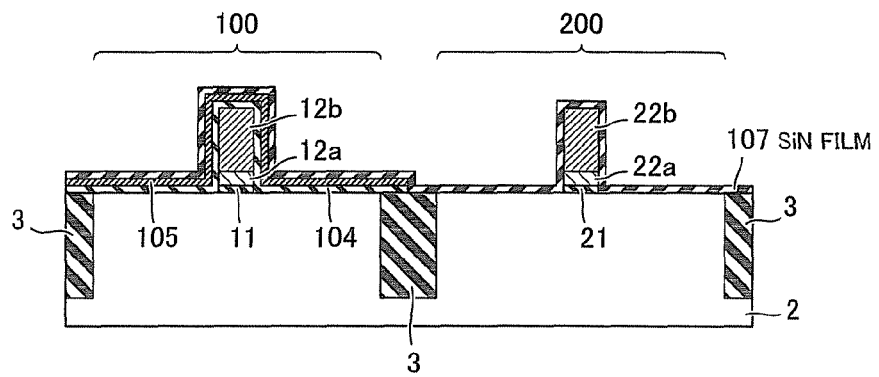

Next, as shown in FIG. 4E, a SiN film 107 is formed so as to cover the low threshold voltage region 100 and the high threshold voltage region 200 on the semiconductor substrate 2.

Here, the SiN film 107 is a film to be processed into the offset spacer 23 in a posterior process, and is formed under the condition in which, e.g., a film forming method is CVD method, a Si raw material is DCS and a film forming temperature is 700° C.

Figure 4F:
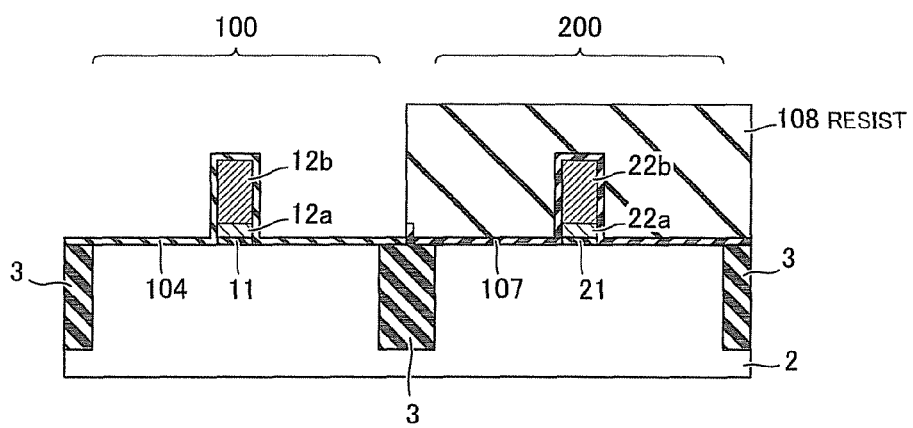

Next, as shown in FIG. 4F, after a resist 108 is formed so as to cover the high threshold voltage region 200, etching is performed on the low threshold voltage region 100 using the resist 108 as a mask in order to selectively remove the SiN film 107 and the cover film 105 in the low threshold voltage region 100. At this time, since the cover film 105 functions as an etching stopper during the etching of the SiN film 107, it is possible to leave the SiN film 104 in the low threshold voltage region 100 without removing.

Here, the SiN film 107 is removed by, e.g., a wet etching method using hot phosphoric acid solution. Meanwhile, the cover film 105 is removed by, e.g., a wet etching method using dilute hydrofluoric acid solution.

Note that, the order of forming the SiN film 104 and the SiN film 107 may be reversed. In case that the SiN film 107 is formed first, the SiN film 107 and the cover film 105 are formed so as to cover the low threshold voltage region 100 and the high threshold voltage region 200, and subsequently, the SiN film 107 and the cover film 105 in the low threshold voltage region 100 are selectively removed. After that, the SiN film 104 is formed so as to cover the low threshold voltage region 100 and the high threshold voltage region 200, and the SiN film 104 and the cover film 105 in the high threshold voltage region 200 are selectively removed.

Figure 4G:
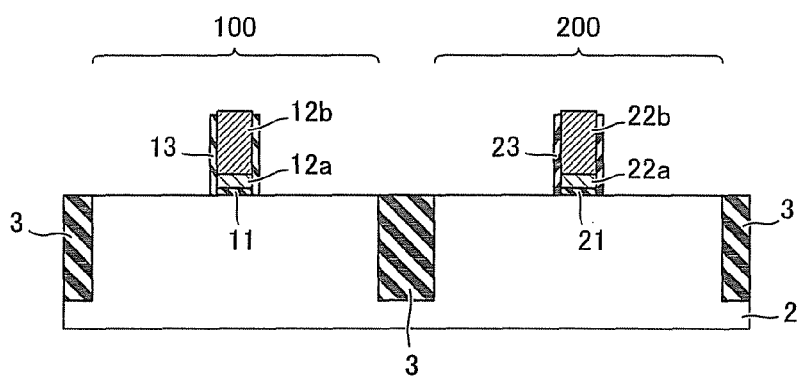

Next, as shown in FIG. 4G, the SiN film 104 in the low threshold voltage region 100 and the SiN film 107 in the high threshold voltage region 200 are etched by the RIE method, etc., and are respectively processed into the offset spacer 13 and the offset spacer 23.

After that, the source/drain regions 14, 24 and the gate sidewalls 15 and 25 are formed. A specific method of forming thereof will be described hereinafter.

Firstly, a conductivity type impurity is each introduced into the low threshold voltage region 100 and the high threshold voltage region 200 by the ion implantation procedure using the gate electrodes 12, 22 and the offset spacers 13 and 23 as a mask, which results in that shallow regions of the source/drain regions 14 and 24 are formed.

Next, after the gate sidewalls 15 and 25 are formed respectively on a side faces of the offset spacer 13 and that of the offset spacer 23, a conductivity type impurity is each introduced into the low threshold voltage region 100 and the high threshold voltage region 200 by the ion implantation procedure using the gate electrodes 12, 22, the offset spacers 13, 23 and the gate sidewalls 15 and 25 as a mask, which results in that deep regions of the source/drain regions 14 and 24 are formed.

Next, the conductivity type impurity contained in the source/drain regions 14 and 24, etc., in the semiconductor substrate 2 is activated by heat treatment such as the RTA method.

Silicide layers may be subsequently formed on the gate electrodes 12, 22 and the source/drain regions 14 and 24.

(Effect of the First Embodiment)

According to the first embodiment, it is possible to control the threshold voltages of the low threshold voltage MISFET 10 and the high threshold voltage MISFET 20 by controlling the formation conditions of offset spacers 13 and 23, thereby providing each appropriate threshold voltage.

Therefore, it is not necessary to implant a high concentration impurity into a channel region for controlling the threshold voltage of MISFET, and thus even when the low threshold voltage MISFET 10 and the high threshold voltage MISFET 20 are microscopic elements, it is possible to suppress dispersion in the threshold voltage caused by fluctuation of the implanted impurity.

Note that, the formation conditions of the offset spacers 13 and 23 are controlled for controlling the threshold voltages of the low threshold voltage MISFET 10 and the high threshold voltage MISFET 20 in the present embodiment since the innermost sidewalls in contact with the gate insulating films 11 and 21 are the offset spacers 13 and 23, however, when other types of sidewalls are the innermost sidewalls which are in contact with the gate insulating films 11 and 21, the formation conditions thereof are controlled. When, for example, only the gate sidewalls 15 and 25 are formed without forming the offset spacers 13 and 23, since the gate sidewalls 15 and 25 are the innermost sidewalls which are in contact with the gate insulating films 11 and 21, the threshold voltages of the low threshold voltage MISFET 10 and the high threshold voltage MISFET 20 are controlled by controlling the formation conditions of the gate sidewalls 15 and 25.

[Second Embodiment]

In the second embodiment, n-type MISFETs having different threshold voltages are formed in a Logic region and an SRAM region. Note that, the explanation will be omitted or simplified for the same points as the first embodiment, such as materials of each member.

Figure 5:
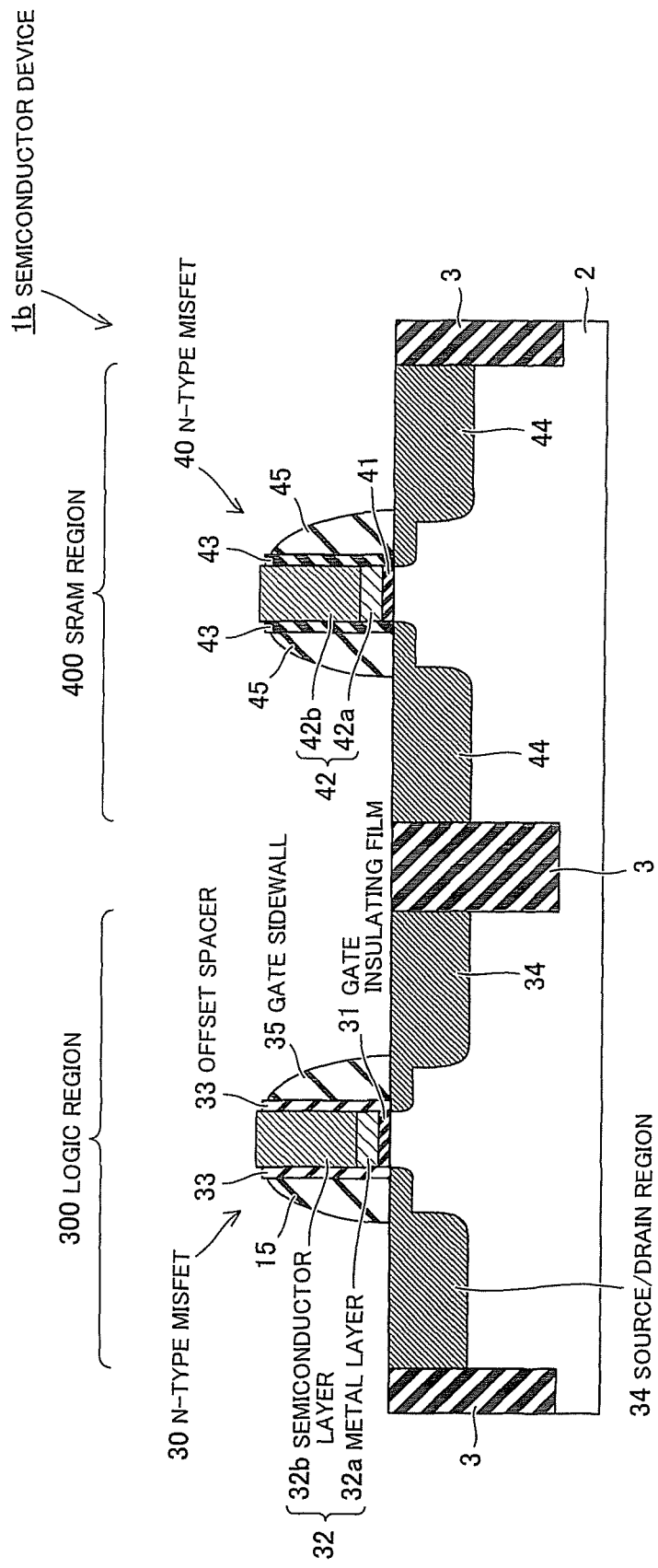
FIG. 5 is a cross sectional view of a semiconductor device according to a second embodiment.

FIG. 5 is a cross sectional view of a semiconductor device 1b according to the second embodiment. The semiconductor device 1b has a Logic region 300 and an SRAM region 400 on the semiconductor substrate 2. The Logic region 300 and the SRAM region 400 are electrically isolated by the element isolation region 3. N-type MISFETs 30 and 40 are respectively formed in the Logic region 300 and the SRAM region 400.

Here, the magnitude of the threshold voltage of a MISFET in an SRAM region is required to be larger than that in a Logic region. Since a threshold voltage is set to positive for an n-type MISFET, an absolute value of threshold voltage is larger for higher threshold voltage, thus, an n-type MISFET having higher threshold voltage is suitable for the SRAM region.

Thus, the n-type MISFET 40 in the SRAM region 400 has higher threshold voltage than the n-type MISFET 30 in the Logic region 300. Therefore, the n-type MISFET 30 and the n-type MISFET 40 respectively correspond to the low threshold voltage MISFET 10 and the high threshold voltage MISFET 20 in the first embodiment.

The n-type MISFET 30 has a gate electrode 32 formed on the semiconductor substrate 2 via a gate insulating film 31, offset spacers 33 formed on side faces of the gate electrode 32 so as to be in contact with the gate insulating film 31, gate sidewalls 35 formed on side faces of the offset spacers 33, and source/drain regions 34 formed in the semiconductor substrate 2 on both sides of the gate electrode 32. Note that, although it is not shown in the figures, a p-type well may be formed in a region in the semiconductor substrate 2 below the n-type MISFET 30.

The n-type MISFET 40 has a gate electrode 42 formed on the semiconductor substrate 2 via a gate insulating film 41, offset spacers 43 formed on side faces of the gate electrode 42 so as to be in contact with the gate insulating film 41, gate sidewalls 45 formed on side faces of the offset spacers 43, and source/drain regions 44 formed in the semiconductor substrate 2 on both sides of the gate electrode 42. Note that, although it is not shown in the figures, a p-type well may be formed in a region in the semiconductor substrate 2 below the n-type MISFET 40.

The gate insulating films 31 and 41 are made of the same material as the gate insulating films 11 and 21 in the first embodiment, and are formed by the same method as the gate insulating films 11 and 21.

The gate electrode 32 includes a metal layer 32a formed on the gate insulating film 31 and a semiconductor layer 32b formed on the metal layer 32a. Meanwhile, the gate electrode 42 includes a metal layer 42a formed on the gate insulating film 41 and a semiconductor layer 42b formed on the metal layer 42a.

The metal layers 32a and 42a are made of the same material as the metal layers 12a and 22a in the first embodiment, and are formed by the same method as the metal layers 12a and 22a.

The semiconductor layers 32b and 42b are made of a Si-based polycrystal such as polycrystalline Si or polycrystalline SiGe containing an n-type impurity such as As or P. In addition, silicide layers may be formed in the upper or entire portion of the semiconductor layers 32b and 42b.

The gate sidewalls 35 and 45 are made of the same material as the gate sidewalls 15 and 25 in the first embodiment, and are formed by the same method as the gate sidewalls 15 and 25.

The source/drain regions 34 and 44 are formed by implanting an n-type type impurity such as As or P into the semiconductor substrate 2. In addition, silicide layers may be formed in upper portions of the source/drain regions 34 and 44.

The offset spacer 33 is made of the same material as the offset spacer 13 in the first embodiment, and is formed by the same method. Meanwhile, the offset spacer 43 is made of the same material as the offset spacer 23 in the first embodiment, and is formed by the same method.

(Effect of the Second Embodiment)

According to the second embodiment, it is possible to set low threshold voltage (small threshold voltage) in the n-type MISFET 30 of the Logic region 300 and to set high threshold voltage (large threshold voltage) in the n-type MISFET 40 of the SRAM region 400 by controlling the formation conditions of the offset spacers 33 and 43.

[Third Embodiment]

In the third embodiment, p-type MISFETs having different threshold voltages are formed in a Logic region and an SRAM region. Note that, the explanation will be omitted or simplified for the same points as the first embodiment, such as materials of each member.

Figure 6:
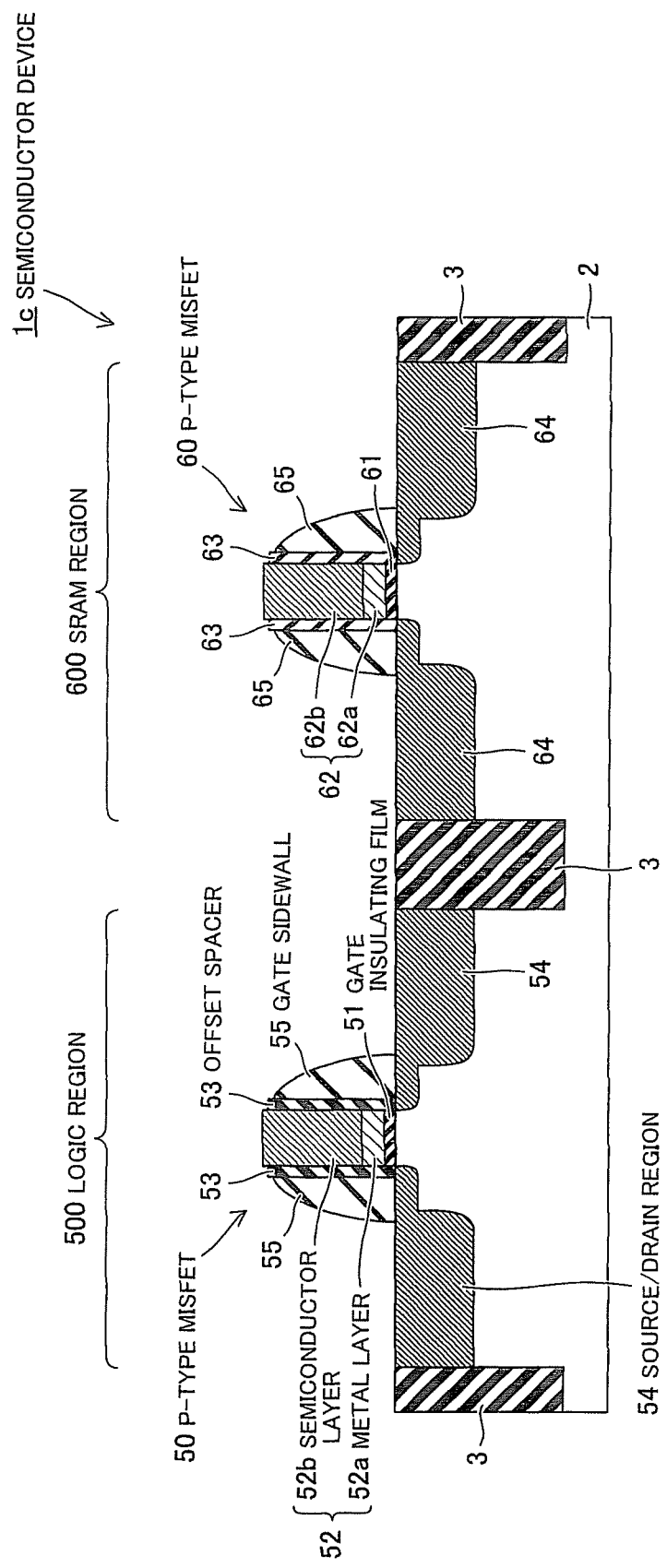
FIG. 6 is a cross sectional view of a semiconductor device according to a third embodiment.

FIG. 6 is a cross sectional view of a semiconductor device 1c according to the third embodiment. The semiconductor device 1c has a Logic region 500 and an SRAM region 600 on the semiconductor substrate 2. The Logic region 500 and the SRAM region 600 are electrically isolated by the element isolation region 3. P-type MISFETs 50 and 60 are respectively formed in the Logic region 500 and the SRAM region 500.

Here, the magnitude of the threshold voltage of a MISFET in an SRAM region is required to be larger than that in a Logic region. Since a threshold voltage is set to negative for a p-type MISFET, an absolute value of threshold voltage is larger for lower threshold voltage, thus, a p-type MISFET having lower threshold voltage is suitable for the SRAM region.

Thus, the p-type MISFET 60 in the SRAM region 600 has lower threshold voltage than the p-type MISFET 50 in the Logic region 500. Therefore, the p-type MISFET 50 and the p-type MISFET 60 respectively correspond to the high threshold voltage MISFET 20 and the low threshold voltage MISFET 10 in the first embodiment.

The p-type MISFET 50 has a gate electrode 52 formed on the semiconductor substrate 2 via a gate insulating film 51, offset spacers 53 formed on side faces of the gate electrode 52 so as to be in contact with the gate insulating film 51, gate sidewalls 55 formed on side faces of the offset spacers 53, and source/drain regions 54 formed in the semiconductor substrate 2 on both sides of the gate electrode 52. Note that, although it is not shown in the figures, an n-type well may be formed in a region in the semiconductor substrate 2 below the p-type MISFET 50.

The p-type MISFET 60 has a gate electrode 62 formed on the semiconductor substrate 2 via a gate insulating film 61, offset spacers 63 formed on side faces of the gate electrode 62 so as to be in contact with the gate insulating film 61, gate sidewalls 65 formed on side faces of the offset spacers 63, and source/drain regions 64 formed in the semiconductor substrate 2 on both sides of the gate electrode 62. Note that, although it is not shown in the figures, an n-type well may be formed in a region in the semiconductor substrate 2 below the p-type MISFET 60.

The gate insulating films 51 and 61 are made of the same material as the gate insulating films 11 and 21 in the first embodiment, and are formed by the same method as the gate insulating films 11 and 21.

The gate electrode 52 includes a metal layer 52a formed on the gate insulating film 51 and a semiconductor layer 52b formed on the metal layer 52a. Meanwhile, the gate electrode 62 includes a metal layer 62a formed on the gate insulating film 61 and a semiconductor layer 62b formed on the metal layer 62a.

The metal layers 52a and 62a are made of the same material as the metal layers 12a and 22a in the first embodiment, and are formed by the same method as the metal layers 12a and 22a.

The semiconductor layers 52b and 62b are made of a Si-based polycrystal such as polycrystalline Si or polycrystalline SiGe containing a p-type impurity such as B or $BF_2$. In addition, silicide layers may be formed in the upper or entire portion of the semiconductor layers 52b and 62b.

The gate sidewalls 55 and 65 are made of the same material as the gate sidewalls 15 and 25 in the first embodiment, and are formed by the same method as the gate sidewalls 15 and 25.

The source/drain regions 54 and 64 are formed by implanting a p-type type impurity such as B or $BF_2$ into the semiconductor substrate 2. In addition, silicide layers may be formed in upper portions of the source/drain regions 54 and 64.

The offset spacer 53 is made of the same material as the offset spacer 23 in the first embodiment, and is formed by the same method. Meanwhile, the offset spacer 63 is made of the same material as the offset spacer 13 in the first embodiment, and is formed by the same method.

(Effect of the Third Embodiment)

According to the third embodiment, it is possible to set high threshold voltage (small threshold voltage) in the p-type MISFET 50 of the Logic region 500 and to set low threshold voltage (large threshold voltage) in the p-type MISFET 60 of the SRAM region 600 by controlling the formation conditions of the offset spacers 53 and 63.

[Fourth Embodiment]

The fourth embodiment is an aspect in which the second embodiment is combined with the third embodiment. Note that, the explanation will be omitted or simplified for the same points as the second and third embodiments, such as materials of each member.

Figure 7:
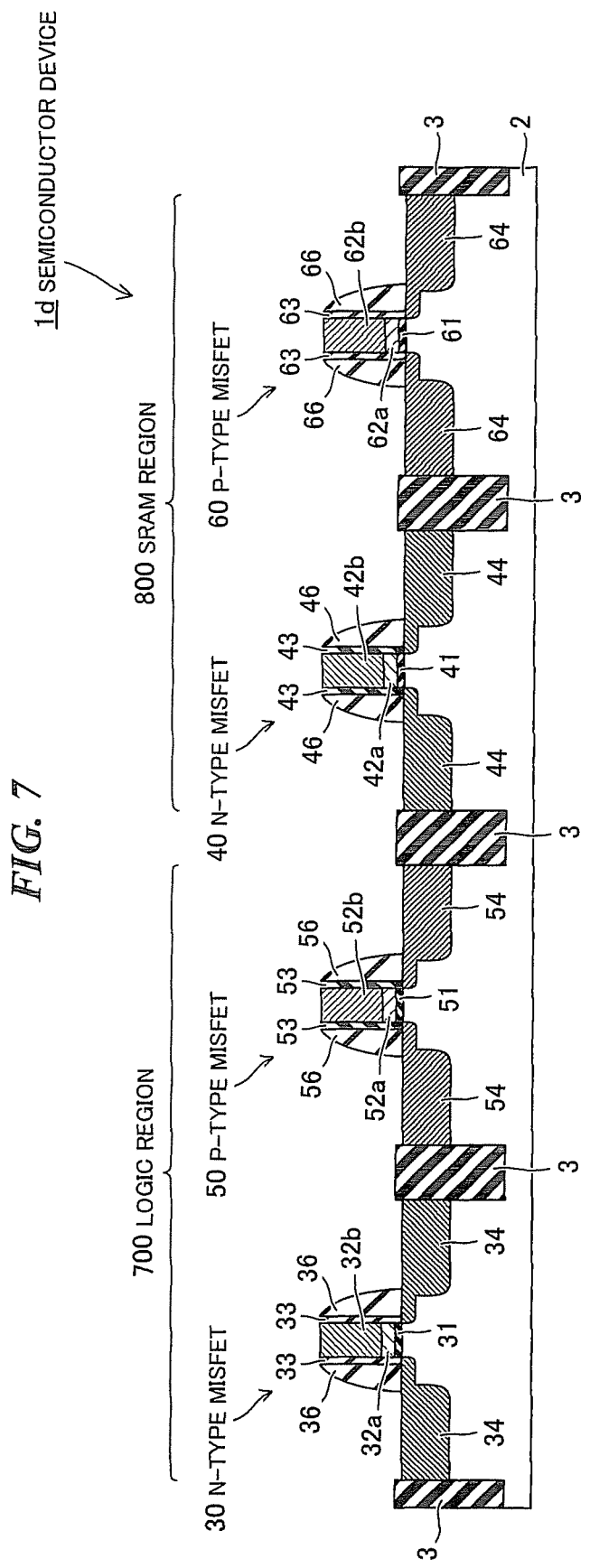
FIG. 7 is a cross sectional view of a semiconductor device according to a fourth embodiment.

FIG. 7 is a cross sectional view of a semiconductor device 1d according to a fourth embodiment. The semiconductor device 1d has a Logic region 700 and an SRAM region 800 on the semiconductor substrate 2. The Logic region 700 and the SRAM region 800 are electrically isolated by the element isolation region 3. The n-type MISFET 30 and the p-type MISFET 50 are formed in a Logic region 700 and the n-type MISFET 40 and the p-type MISFET 60 are formed in an SRAM region 800.

Here, the n-type MISFETs 30 and 40 respectively have the same configuration as those of the n-type MISFETs 30 and 40 in the second embodiment, and the p-type MISFETs 50 and 60 respectively have the same configuration as those of the p-type MISFETs 50 and 60 in the third embodiment.

(Effect of the Fourth Embodiment)

According to the fourth embodiment, it is possible to set small threshold voltage in the n-type MISFET 30 and the p-type MISFET 50 of the Logic region 700 and to set large threshold voltage in the n-type MISFET 40 and the p-type MISFET 60 of the SRAM region 800 by controlling the formation conditions of the offset spacers 33, 43, 53 and 63.

(Other Embodiments)

It should be noted that the present invention is not intended to be limited to the above-mentioned first to fourth embodiments, and the various kinds of changes thereof can be implemented by those skilled in the art without departing from the gist of the invention.

Furthermore, it is possible to arbitrarily combine the configurations of the above-mentioned first to fourth embodiments without departing from the gist of the invention.

What is claimed is:

1. A semiconductor substrate, comprising:
a first transistor having a first gate insulating film formed on a semiconductor substrate, a first gate electrode formed on the first gate insulating film and a first sidewall formed on a side face of the first gate electrode, the first gate insulating film comprising a high-dielectric constant material as a base material, a part of the first sidewall contacting with the first gate insulating film and containing Si and N; and
a second transistor having a second gate insulating film formed on the semiconductor substrate, a second gate electrode formed on the second gate insulating film and a second sidewall formed on a side face of the second gate electrode so as to contact with the second gate insulating film, the second gate insulating film comprising a high-dielectric constant material as a base material, a part of the second sidewall contacting with the second gate insulating film and containing Si and N,
wherein at least one of an abundance ratio of Si—H bond to N—H bond per unit volume, an amount of Cl per unit volume and an amount of H per unit volume of the second sidewall is larger than that of the first sidewall; and
a threshold voltage of the second transistor is higher than that of the first transistor.

2. The semiconductor device according to claim 1, wherein the first and second sidewalls are made of SiN.

3. The semiconductor device according to claim 1, wherein a base material of the first gate insulating film is the same high-dielectric constant material as that of the second gate insulating film.

4. The semiconductor device according to claim 3, wherein the first and second sidewalls are made of SiN.

5. The semiconductor device according to claim 1, wherein the first transistor has the same conductivity type as the second transistor.

6. The semiconductor device according to claim 5, wherein the first and second sidewalls are made of SiN.

7. The semiconductor device according to claim 5, wherein the first transistor is an n-type transistor formed in a Logic region; and
the second transistor is an n-type transistor formed in an SRAM region.

8. The semiconductor device according to claim 5, wherein the first transistor is a p-type transistor formed in an SRAM region; and
the second transistor is a p-type transistor formed in a Logic region.

* * * * *